US010468867B2

(12) United States Patent
Meyer et al.

(10) Patent No.: US 10,468,867 B2
(45) Date of Patent: Nov. 5, 2019

(54) ARC FAULT DETECTION UNIT (71) Applicant: Siemens Aktiengesellschaft, Munich (DE)

(72) Inventors: Joerg Meyer, Dresden (DE); Karsten Wenzlaff, Dresden (DE); Peter Schegner, Dresden (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 303 days.

(21) Appl. No.: 15/603,586

(22) Filed: May 24, 2017

(65) Prior Publication Data
US 2017/0346272 A1 Nov. 30, 2017

(30) Foreign Application Priority Data
May 31, 2016 (DE) .................. 10 2016 209 445

(51) Int. Cl.
*H02H 1/00* (2006.01)
*G01R 31/02* (2006.01)
*H02H 3/16* (2006.01)

(52) U.S. Cl.
CPC ......... *H02H 1/0015* (2013.01); *G01R 31/024* (2013.01); *G01R 31/025* (2013.01); *H02H 3/16* (2013.01)

(58) Field of Classification Search
CPC ...... H02H 1/0015; H02H 3/16; G01R 31/024; G01R 31/025
See application file for complete search history.

(56) References Cited

U.S. PATENT DOCUMENTS 5,452,223 A  9/1995 Zuercher et al.
5,561,605 A * 10/1996 Zuercher ............. G01R 31/025
                                                        324/102

(Continued)

FOREIGN PATENT DOCUMENTS

CN  1276061 A  12/2000
CN  101454859 A  6/2009

(Continued)

OTHER PUBLICATIONS

European Search Report dated Oct. 27, 2017.

(Continued)

*Primary Examiner* — Scott Bauer
(74) *Attorney, Agent, or Firm* — Harness, Dickey & Pierce, P.L.C.

(57) ABSTRACT

An arc fault detection unit is disclosed for a low-voltage electrical circuit. The arc fault detection unit includes at least one voltage sensor, for periodically determining electrical voltage values of the electrical circuit, connected to an evaluation unit. The evaluation unit is designed such that a first half of a first number of voltage values is continuously summed to form a first partial sum and the second half of the voltage values is continuously summed to form a second partial sum and a difference of the two partial sums is calculated. Either as one alternative the difference or the amplitude of the difference is compared with a first threshold value and if the value is exceeded, an arc fault detection signal is output; or as a second alternative the difference is compared with a second threshold value and if the value is undershot, an arc fault detection signal is output.

25 Claims, 5 Drawing Sheets

(56) References Cited

U.S. PATENT DOCUMENTS

| | | | |
|---|---|---|---|
| 5,710,696 A | 1/1998 | Reynolds et al. | |
| 5,839,092 A * | 11/1998 | Erger | G01R 31/025 702/58 |
| 7,633,729 B2 * | 12/2009 | Oldenburg | H02H 1/0015 361/42 |
| 7,656,626 B2 | 2/2010 | Carton et al. | |
| 8,576,520 B2 * | 11/2013 | Pamer | G01R 31/1227 361/10 |
| 8,599,523 B1 | 12/2013 | Ostrovsky et al. | |
| 2009/0120773 A1 | 5/2009 | Gentsch et al. | |
| 2012/0316804 A1 | 12/2012 | Oberhauser | |
| 2014/0247066 A1 | 9/2014 | Chaintreuil et al. | |
| 2014/0379283 A1 | 12/2014 | Belhaja et al. | |
| 2016/0003883 A1 | 1/2016 | Chaintreuil et al. | |

FOREIGN PATENT DOCUMENTS

| | | |
|---|---|---|
| CN | 102539997 A | 7/2012 |
| CN | 102565578 A | 7/2012 |
| CN | 102856887 A | 1/2013 |
| CN | 103635820 A | 3/2014 |
| CN | 104237748 A | 12/2014 |
| CN | 105334425 A | 2/2016 |
| CN | 105448617 A | 3/2016 |
| EP | 0639879 A2 | 2/1995 |
| EP | 1657559 B1 | 9/2007 |
| EP | 2916455 A1 | 9/2015 |

OTHER PUBLICATIONS

German Office Action #2016P09912 dated Feb. 24, 2017.

Yang Vi et al; "Study on the Fault Arc On-fine Detecting Based on Wavelet Singularity Detection Principle"; WASE International Conference on Information Engineering; vol. 2; pp. 151-154; Dec. 31, 2009;;.

Cai Zhiyuan et al; "New Technology on Arc Fault Recognition and Protection"; Electrical Appliances and Energy Efficiency Management Technology; Dec. 31, 2014; pp. 24-27;;.

Chinese Office Action and English translation thereof dated Jun. 27. 2019.

* cited by examiner

ARC FAULT DETECTION UNIT

PRIORITY STATEMENT

The present application hereby claims priority under 35 U.S.C. § 119 to German patent application number DE 102016209445.9 filed May 31, 2016, the entire contents of which are hereby incorporated herein by reference.

FIELD

At least one embodiment of the invention generally relates to an arc fault detection unit, a circuit breaker, an earthing switch and/or a method for arc fault detection.

BACKGROUND

In low-voltage electrical circuits and low-voltage systems, or rather low-voltage networks, i.e. circuits for voltages up to 1000 V AC voltage or 1500 V DC voltage, short circuits are usually associated with the occurrence of arc faults, such as parallel or serial arc faults. In high-power distribution and switchgear systems in particular, if these are not shut down sufficiently quickly this can lead to irretrievable damage to equipment, system parts or entire switchgear systems. To prevent long-lasting and widespread failure of the power supply and to reduce personal injuries, it is necessary to detect and extinguish such arc faults, in particular high-current or parallel arc faults, within a few milliseconds. Conventional protection systems of power supply systems (e.g. fuses and circuit breakers) cannot provide reliable protection under the required time constraints.

Here, circuit breakers are in particular meant to refer to low-voltage switches. Circuit breakers, in particular in low-voltage systems, are usually used for currents from 63 to 6,300 amperes. More particularly, sealed circuit breakers, such as molded case circuit breakers, are used for currents from 63 to 1600 amperes, in particular from 125 to 630 or 1200 amperes. Open circuit breakers, such as air circuit breakers, are used in particular for currents from 630 to 6300 amperes, more particularly from 1200 up to 6300 amperes.

Circuit breakers in the sense of the invention can in particular comprise an electronic trip unit, abbreviated to ETU.

Circuit breakers monitor the current flowing through them and interrupt the electrical current or energy flow to an energy sink or a consumer, a process known as tripping, if current limit values or current time interval limit values, i.e. if a current value is present for a certain period of time, are exceeded. The determination of the tripping conditions and the tripping of a circuit breaker can be performed by way of an electronic trip unit.

Earthing switches are special devices for short-circuiting cables or power rails, in order to produce defined short circuits for the protection of electrical circuits or systems.

SUMMARY

Conventional arc fault detection systems evaluate the light emission generated by the arc and use this to detect the arc fault. The inventors have recognized that this has the disadvantage that fiber-optic cable or optical detection systems must be laid parallel to the electrical cables or power rails, in order to detect any arc faults that may occur.

At least one embodiment of the present invention specifies a device for detecting arc faults.

At least one embodiment is directed to an arc fault detection unit, at least one embodiment is directed to a circuit breaker, at least one embodiment is directed to an earthing switch and at least one embodiment is directed to a method.

According to at least one embodiment of the invention, it is provided that an arc fault detection unit for a low-voltage electrical circuit comprises at least one voltage sensor, for periodically determining electrical voltage values ($u(k)$) of the electrical circuit, and an evaluation unit connected thereto. This is designed in such a way that a first half of a first number of voltage values ($u(k)$) is continuously summed to form a first partial sum (TS1) and the second half of the voltage values ($u(k)$) is continuously summed to form a second partial sum (TS2). A difference (DU) of the two partial sums is calculated. Either as one alternative the difference (DU) or the amplitude of the difference (DU) is compared with a first threshold value (SW1). If the value is exceeded an arc fault detection signal (SLES) is output.

According to at least one embodiment of the invention, a method for arc fault detection for an electrical circuit is also provided. In the method, electrical voltage values ($u(k)$) of the electrical circuit are periodically determined. A first half of a first number of voltage values ($u(k)$) is continuously summed to form a first partial sum (TS1) and the second half of the voltage values ($u(k)$) is continuously summed to form a second partial sum (TS2). A difference (DU) of the two partial sums is calculated. Either as one alternative the difference (DU) or the amplitude of the difference (DU) is compared with a first threshold value (SW1) and if the value is exceeded an arc fault detection signal (SLES) is output.

Advantageous designs of the invention are described in the claims.

BRIEF DESCRIPTION OF THE DRAWINGS

The described properties, features and advantages of this invention and the manner in which these are achieved will become clearer and more comprehensible in conjunction with the following description of the example embodiments, which are explained in more detail in connection with the drawings.

They show.

DETAILED DESCRIPTION OF THE EXAMPLE EMBODIMENTS

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "example" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

According to at least one embodiment of the invention, it is provided that an arc fault detection unit for a low-voltage electrical circuit comprises at least one voltage sensor, for periodically determining electrical voltage values (u(k)) of the electrical circuit, and an evaluation unit connected thereto. This is designed in such a way that a first half of a first number of voltage values (u(k)) is continuously summed to form a first partial sum (TS1) and the second half of the voltage values (u(k)) is continuously summed to form a second partial sum (TS2). A difference (DU) of the two partial sums is calculated. Either as one alternative the difference (DU) or the amplitude of the difference (DU) is compared with a first threshold value (SW1). If the value is exceeded an arc fault detection signal (SLES) is output.

Or as a second alternative the difference (DU) is compared with a second threshold value (SW2) and if it falls below this value, an arc fault detection signal (SLES) is output.

As an alternative to both, a parallel comparison can also be made with respect to the two threshold values, and if the value is exceeded or undershot an arc fault detection signal is output.

The amplitudes of the first and the second threshold value can be identical while their signs are different.

Advantageous designs of the invention are described in the claims.

In an advantageous design of the invention the low-voltage electrical circuit is an AC circuit.

This has the particular advantage that the invention can be employed particularly effectively.

In an advantageous design of at least one embodiment of the invention, the arc fault detection unit is designed in such a way that the voltage values (u(k)) are determined at a multiple of the frequency of the low-voltage electrical circuit or at a sampling frequency in the range of 2-100 kHz, in particular in the range of 10 to 40 or 60 kHz, more specifically at 40-50 kHz.

This has the particular advantage that an optimal number of voltage values is available for the evaluation according to at least one embodiment of the invention. At a line frequency of the low-voltage electrical circuit of 50 or 60 Hz, there are thus approximately 1000 voltage values available per fundamental cycle of the line frequency. This number has been shown to provide a good detection of arc faults using at least one embodiment of the invention.

In an advantageous design of at least one embodiment of the invention, the evaluation unit is designed in such a way that the first number is defined by a time window. In other words, the number of current values to be summed is determined by a time window to be used. In addition, by way of the time window, which can be for example in the range from 0.1 to 5 ms or 10 ms, in particular can be 1 ms, together with the sampling frequency used, the first number of voltage values can be obtained.

This has the particular advantage that the evaluation is carried out section by section and thus facilitates a particularly accurate detection of arc faults.

In an advantageous design of at least one embodiment of the invention, the evaluation unit is designed in such a way that a difference calculation is performed for each determined voltage value (u(k)). In other words, the difference calculation according to at least one embodiment of the invention is performed continuously for each new voltage value.

This has the particular advantage of enabling a particularly prompt and rapid determination of arc faults.

In an advantageous design of at least one embodiment of the invention, the evaluation unit is designed in such a way that the difference (DU) is multiplied by a factor, the magnitude of which depends on the first number. In particular, the factor is a product of a constant and the reciprocal of the first number.

This has the particular advantage that a normalized difference (DU) is available, which is compared with normalized threshold values. This enables an evaluation to be carried out with an objective comparison.

In an advantageous design of at least one embodiment of the invention, the evaluation unit is designed in such a way that a second number of differences (DU) is continuously summed to form a difference sum (DS), the difference sum (DS) being compared instead of the difference (DU) with the first or second threshold value (SW1, SW2), and if the value is exceeded or undershot an arc fault detection signal (SLES) is output.

This has the particular advantage that it facilitates an even more accurate determination of arc faults, since the differences that occur during arc faults are summed. This means that a more accurate, or larger, value is available for the threshold value comparison.

In addition, in an advantageous design of at least one embodiment of the invention, at least one current sensor is provided, which periodically determines electric current values of the electrical circuit. This is connected to the evaluation unit, which is designed in such a way that the determined current value is continuously compared with a third threshold value (SW3), and only if the value is exceeded an arc fault detection signal (SLES) is output.

This has the particular advantage that a further criterion for the existence of an arc fault is available, thus avoiding the erroneous issuing of an arc fault detection signal. Arc faults frequently occur only at higher currents. This is taken into account according to at least one embodiment of the invention during the evaluation.

According to at least one embodiment of the invention, a circuit breaker for a low-voltage electrical circuit is also provided. This comprises an arc fault detection unit according to at least one embodiment of the invention. The latter is connected to the circuit breaker, these being designed in such a way that when an arc fault detection signal is output, the circuit breaker trips, i.e. it interrupts the electrical circuit. This means that the arc fault can be extinguished. If the circuit breaker comprises an electronic trip unit, a very fast tripping of the circuit breaker can be achieved in the event of an arc fault detection signal.

This has the particular advantage that a circuit breaker is extended to include a further advantageous functionality for the protection of electrical systems. The detection and shutdown of arc faults is therefore advantageously effected in one device. Where possible, it can be combined with existing modules, such as voltage and/or current sensors, a power supply, microprocessors for the evaluation unit, etc., and so synergies are achieved.

According to at least one embodiment of the invention, an earthing switch is also provided, comprising an arc fault detection unit that is connected to the earthing switch. These are designed in such a way that when an arc fault detection signal is output, the earthing switch short-circuits the electrical circuit, in order to extinguish the arc fault.

This has the particular advantage of providing a simple, rapid and effective way of extinguishing arc faults.

According to at least one embodiment of the invention, a method for arc fault detection for an electrical circuit is also provided. In the method, electrical voltage values (u(k)) of the electrical circuit are periodically determined. A first half of a first number of voltage values (u(k)) is continuously summed to form a first partial sum (TS1) and the second half of the voltage values (u(k)) is continuously summed to form a second partial sum (TS2). A difference (DU) of the two partial sums is calculated. Either as one alternative the difference (DU) or the amplitude of the difference (DU) is compared with a first threshold value (SW1) and if the value is exceeded an arc fault detection signal (SLES) is output.

Or as a second alternative the difference (DU) is compared with a second threshold value (SW2) and if the value is undershot an arc fault detection signal (SLES) is output.

As an alternative to both, the difference can also be compared with the first and the second threshold value, and if either of the values is exceeded or undershot an arc fault detection signal (SLES) can be output. In this case the amplitudes of the first and second threshold value can be identical.

This has the particular advantage of producing a simple method for the detection of arc faults.

All designs and features of embodiments of the invention result in an improvement in the detection of arc faults and in extinguishing them.

Figure 1:
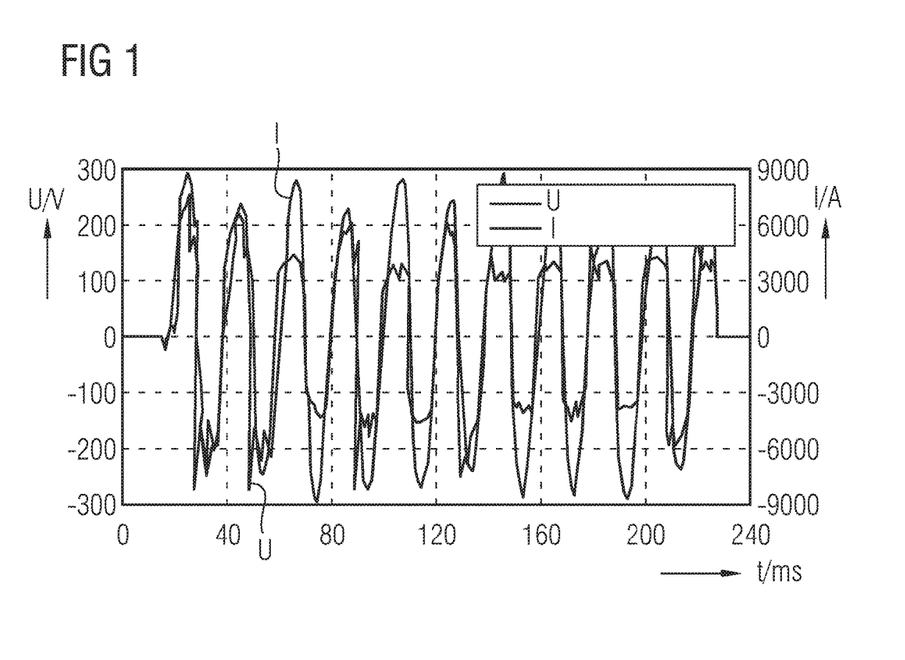
FIG. 1 illustrates a graph of the voltage and current temporal waveform after arc ignition.

In an electrical circuit or network in which an arc fault is ignited, a current and voltage waveform can be measured that shows a characteristic waveform. A typical voltage and current waveform for an arc fault is shown in FIG. 1. This shows an illustration of a graph showing the temporal waveform of the electrical voltage U and the electrical current I after ignition of an arc or arc fault, in particular parallel arc faults, in an electrical circuit, in particular a low-voltage electrical circuit.

On the horizontal x-axis the time t is plotted in milliseconds (ms). On the vertical y-axis the left-hand scale shows the amplitude of the electrical voltage U in volts (V). The right-hand scale shows the amplitude of the electric current I in amperes (A).

After the arc ignition the current I is approximately sinusoidal. The voltage U is severely distorted, approximately "sawtooth-shaped", with rapid voltage changes. Roughly interpreted, to a first approximation the voltage waveform is rectangular, instead of a usual sinusoidal waveform. Considered in the abstract, a rectangular shape can be identified in the voltage waveform, which exhibits a highly stochastic component on the plateau. The rectangular shape is characterized by the fact that, during the arc ignition and in the subsequent voltage zero crossings of the AC voltage, significantly increased voltage changes occur which are designated hereafter by the term voltage jump, since the upward slope of the voltage change is substantially greater in comparison to a sinusoidal voltage waveform.

According to an embodiment of the invention, such voltage changes or voltage jumps are to be detected, whereupon an arc fault detection signal is to be output.

For this purpose voltage values of an electrical circuit are periodically determined, recorded or measured, for example with a fixed sampling period or sampling frequency fa. The sampling frequency or measuring frequency should be a multiple of the frequency of the measured alternating parameters. For example, in standard electricity networks, with a line frequency of, for example, 50 Hz or 60 Hz, the measuring frequency could be in the kilohertz range, for example, between 1 and 200 kHz, more specifically in the range 10 to 40 or 60 kHz, in particular between 40-50 kHz.

These voltage values are to be used according to an embodiment of the invention to determine an arc fault detection signal.

According to an embodiment of the invention, the voltage jump during the arc ignition and in each subsequent voltage zero crossing is to be detected, whereupon an arc fault is to be detected. A significant advantage in the extraction of this signal property in the voltage waveform is its periodic occurrence. An additional detection reliability is therefore achieved, if either intentionally or unintentionally the first occurrence of the signal property during the arc ignition does not lead to a detection of the arc fault.

For the extraction of this signal property, according to the invention a summation with difference calculation is to be used, which is to be designated as a W-RU, and in one design as W-RU's method.

The evaluation is carried out by introducing a difference or voltage jump DU. This is calculated as follows:

$$DU(n) = \sum_{k=n-(j-1)}^{k=n-\frac{j}{2}} u(k) - \sum_{k=n-(\frac{j}{2}-1)}^{k=n} u(k) \quad (1)$$

wherein:
u(k) the voltage value at the (previous) time k
u(n) the voltage value at the current time n
DU(n) the difference from the current time n
j a first number, i.e. the number of times or samples used for the calculation of the difference.

The above formula is used to calculate the difference DU(n) for a voltage value u(n) currently being measured. The basis of the calculation is the first number j, which can be, for example, a fixed number. For example, a fixed number j of samples is used for each calculation. For example, j can be in the range from 10 to 100, in particular in the range 40-50.

The calculation will be illustrated for the case where j=40.

This is achieved using the voltage value u(n) currently being measured and the preceding or rather earlier or past 39 voltage values
u(n−1) to u(n−(40−1)), i.e.
u(n−1) to u(n−40+1), i.e.
u(n−1) to u(39).

In total, (j=)40 voltage values.

For the first partial sum (TS1), the voltage values u(k) for $$k=n-(j-1)=n-(40-1)=n-39$$

to $$k=n-j/2=n-40/2=n-20$$

are added, i.e. from the previous (older) 39th voltage value to the previous (more recent) 20th voltage value, in total 20 values.

As the second partial sum (TS2), the voltage values u(k) for $$k=n-(j/2-1)=n-(40/2-1)=n-19$$

to $$k=n$$

are added, i.e. from the previous 19th voltage value up to the current voltage value u(n), in total, also 20 voltage values.

The difference DU of the two partial sums is compared with a first threshold value SW1, dependent on the number j. If the valve is exceeded an arc fault detection signal is output.

In this case each of the halves of the first number j are summed. Within the meaning of an embodiment of the invention, the term half also means a value which is different from half the value. In other words, in accordance with a first variant in the first partial sum 19 values and in the second partial sum 21 values could be summed, where j has the value 40.

In a second variant, in the case of an odd first number j an asymmetrical partitioning is meant. In other words, in a first partial sum, for example, 19 values and in the second partial sum 20 values could be summed, where in this case j would have the value 39.

Mean values can also be used as partial sums, which can be determined from the respective voltage values, for example by way of partial sums. In other words a mean value could also be formed from a significantly different number of voltage values, for example, for each partial sum.

Alternatively, both of the partial sums, or the difference, can be multiplied by a factor which for example contains the reciprocal of the first number j, i.e. for example, by 1/j or 2/j.

$$DU(n) = \frac{2}{j}\left[\sum_{k=n-j+1}^{k=n-\frac{j}{2}} u(k) - \sum_{k=n-\frac{j}{2}+1}^{k=n} u(k)\right] \quad (2)$$

This enables a comparison with a first threshold value SW1 which is independent of the number of samples used, i.e. of the first number, because the difference is normalized to the voltage used in the circuit, i.e. corresponds to the equivalent voltage jump taking place.

The value of the difference is thus no longer dependent on the number of summations, but rather on the voltage used.

In accordance with the first or second variant, the half can be split into a first partial sum number g and h, where y=g+h and g≠h.

$$DU(n) = \frac{1}{g}\sum_{k=n-(g+h)+1}^{k=n-h} u(k) - \frac{1}{h}\sum_{k=n-h+1}^{k=n} u(k) \quad (3)$$

The first number j, or rather number of sampling values j used, determines the time frame used via the sampling frequency used.

Conversely, for a given sampling frequency and time window to be analyzed, the first number to be used can be determined.

The three variables time window ta, sampling frequency fa and number of sampling values (=first number) j can each be expressed in terms of each other, j=ta·fa.

For a line frequency of the low-voltage electrical circuit of 50-60 Hz, a sampling frequency of 1 to 200 kHz, in particular 1 to 60 kHz, more specifically 40-50 kHz and a time window or a dilation time of 0.1 ms to 5 ms or 10 ms, in particular of approximately 1 ms, have been shown to provide a reliable detection of arc faults. For the first number j of the required sampling values or sampling points this therefore gives j=40-50.

Dilation time means the length of the time window over which the partial sums or the equivalent voltage jump are calculated.

The two partial sums TS1 and TS2 can also be interchanged. In other words, the first partial sum is deducted from the second partial sum. This merely changes the sign.

In the same way, for example, in the case of AC networks after an edge change, i.e. when a change is made from a rising edge to a falling edge of the typically sinusoidal AC voltages, a sign change can also occur.

In sinusoidal voltages a rising edge occurs usually in the range from 0° to 90° and 270° to 360°, a falling edge typically in the range from 90° to 270°.

If, instead of the amplitude of the difference DU, the absolute value is compared with the first or second threshold value, a change of the sign may be required.

It is essential that at least substantively, at least one amplitude of the difference DU is compared with at least one amplitude of the first or second threshold value SW1, SW2. If the threshold value is exceeded in terms of its amplitude, an arc fault detection signal SLES is output. Ideally, the amplitude of the difference can be compared with the first threshold value SW1, in order to obtain a particularly good detection of arc faults.

In general, the difference determined can also be compared with two threshold values SW1, SW2, the first threshold value SW1 being positive and if the value is exceeded, analogously to the amplitude of the difference, an arc fault detection signal SLES being output, and the second threshold value SW2 being negative (for negative differences) and if the value is undershot an arc fault detection signal SLES being output.

For a reliable detection of an arc fault it is necessary to differentiate the operational case—system without arc fault—from the fault case—system with arc fault. A threshold value comparison enables the distinction to be made between the states: (a) arc fault present and (b) no arc fault present.

Figure 3:
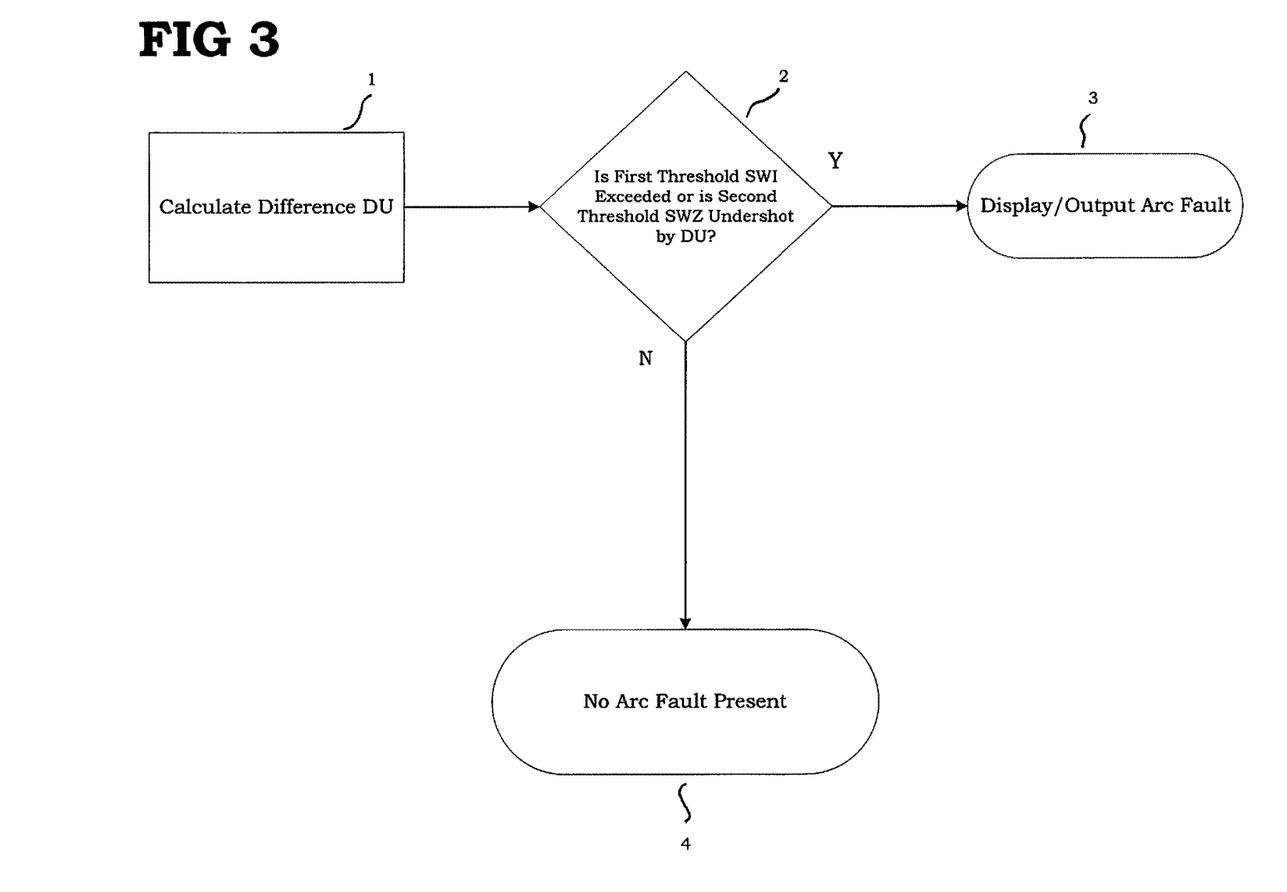
FIG. 3 illustrates a first flow diagram for arc fault detection.

FIG. 3 shows a diagram of such a case. In a first step 1, the continuous calculation of the difference DU according to an embodiment of the invention is performed.

In a second step 2, each of these is compared with the first threshold value SW1 or second threshold value SW2.

If the first threshold value SW1 is exceeded or the second threshold value SW2 is undershot, in a third step 3 the detection of an arc fault is displayed and/or an arc fault detection signal is output.

If the first threshold value SW1 is not exceeded or the second is not undershot, in a fourth step 4 it can be reported that no arc fault is present.

For example, in the case of a normalized calculation the first threshold value SW1 can be in the range of 8 volts to 300 volts, in particular 10 to 30 or 100 volts, more specifically in the range of 15 to 20 or 25 volts.

It should be noted here that the calculated difference DU or equivalent voltage jump is below the actual voltage jump that can be detected in the voltage waveform.

Further improvement can be obtained by a further summation of the differences DU to form a difference sum DS. This will also be designated in the following as W-RU's method. In the case of arc faults that do not generate a large voltage jump, a more rapid detection can thus be achieved.

In the W-RU's method individual differences or voltage jumps, which occur in particular during the arc ignition as a result of multiple small, successively igniting arcs, are summed.

The determined differences DU are summed with a second number z, which can be in the region of the first number j but can also be larger or smaller, to form a difference sum DS. For example, the second number z can have one to four or six times the value of j.

$$DS(n) = \sum_{k=n-z}^{k=n} DU(k) \tag{4}$$

z second number, i.e. number of differences DU that are used for the calculation of the difference sum
DS (n) difference sum, relative to the current value n.

The second number z can here again be defined via the sampling frequency fa and the time window ts to be considered for the summation, $z = ts \cdot fa$.

When using the summation the first time window or first dilatation time ta can or should be chosen to be suitable for the calculation of the individual voltage jumps, for example, chosen to be smaller. The time ta could here be approximately 0.05 to 1 ms, in particular be 0.2 ms.

It has further proved advantageous if the differences used for the summation are not used for the subsequent summation a second time.

For a simple, computational implementation of the algorithm, for example, for each voltage value u(n) or sample point a relative, equivalent voltage jump or sample difference DA(n) can be calculated per voltage value u(n), relative to the first number j or magnitude of the dilation parameter, as follows:

$$DA(n) = \frac{DU(n)}{j} \tag{5}$$

In other words, the difference DU is divided by the first number j to obtain the sample difference for a voltage value u(n). The calculated sample difference DA(n) describes the relative, equivalent voltage jump per voltage value u(n) or sample value. A kind of normalization is carried out.

For example, a first voltage value u(1) of 36 volts, a subsequent second voltage value u(2) of 40 volts, a subsequent third voltage value u(3) of 50 volts, a subsequent fourth voltage value u(4) of 60 volts, a subsequent fifth voltage value u(5) of 70 volts, a subsequent sixth voltage value u(6) of 72 volts, and a subsequent seventh voltage value u(7) of 74 volts is measured.

For example, the first number j has a value of 4.

According to formula 2, the first partial sum is 76 volts, the second partial sum 110 volts. The pure difference between the partial sums is 34 volts, multiplied by 2/j, i.e. 2/4, making the difference DU(4) 17 volts. In other words, the difference corresponds to a voltage jump averaged over the 4 voltage values of 17 volts.

In relation to the first four voltage values or samples u(1), . . . , u(4) the sample difference DA(4) is: 17 volts divided by 4 equals 4.25 volts (i.e. the relative voltage jump per voltage value).

In relation to the next four voltage values u(2), . . . , u(5), the difference of the partial sums is 130 volts−90 volts=40 volts. The difference DU(5) in turn is then 20 volts. The sample difference DA(5) is 5 volts (i.e. the relative voltage jump per voltage value).

In relation to the next four voltage values u(3), . . . , u(6) the difference of the partial sums is 142 volts−110 volts=32 volts, the difference DU(6) is then 16 volts, the sample difference DA(6) is 4 volts (i.e. the relative voltage jump per voltage value).

In relation to the next four voltage values u(4), . . . , u(7) the difference of the partial sums is 146 volts−130 volts=16 volts, the difference DU(7) is then 8 volts, the sample difference DA(7) is 2 volts (i.e. the relative voltage jump per voltage value).

In one design of an embodiment of the invention, the respective maximum value is to then be summed for each (continuously) calculated sample difference DA(n).

To do this, the sample difference DA(n) is assigned to each of the j voltage values that were used for the calculation of the difference and sample difference, see the following table.

| n | U(n) | DA(1) | DA(2) | DA(3) | DA(4) | DA(5) | DA(6) | DA(7) | DAmax(n) |
|---|------|-------|-------|-------|-------|-------|-------|-------|----------|
| 1 | 36 V | 4.5 V (0 V) | 9.5 V (0 V) | 6.75 V (0 V) | 4.25 V | | | | 4.25 V |
| 2 | 40 V | | 9.5 V (0 V) | 6.75 V (0 V) | 4.25 V | 5 V | | | 5 V |
| 3 | 50 V | | | 6.75 V (0 V) | 4.25 V | 5 V | 4 V | | 5 V |
| 4 | 60 V | | | | 4.25 V | 5 V | 4 V | 2 V [0 V] | 5 V |
| 5 | 70 V | | | | | 5 V | 4 V | 2 V [0 V] | 5 V |

| n | U(n) | DA(1) | DA(2) | DA(3) | DA(4) | DA(5) | DA(6) | DA(7) | DAmax(n) |
|---|---|---|---|---|---|---|---|---|---|
| 6 | 72 V | | | | | | 4 V | 2 V [0 V] | 4 V |
| 7 | 74 V | | | | | | | 2 V [0 V] | 2 V [0 V] |

If the first number j of voltage values u(n), u(k) is not yet available for a calculation, the differences or sample differences can be set to zero, see the values of 0 volts given in parentheses in columns DA(1), DA(2), DA(3).

From the j assigned sample differences per voltage value u(n), the maximum sample difference DAmax(n) is calculated in each case. For the immediately preceding sample differences DA(n) of course, there are only fewer than j sample differences, wherein the current or maximum sample difference DA of the available sample differences is then used.

The maximum sample differences DAmax per voltage value u(n) are summed to form a sum of the maximum sample differences SMA, namely in each case a second number z of maximum sample differences SMA.

$$SMA(n) = \sum_{k=n-z}^{k=n} DAmax(k) \quad (6)$$

If the second number z has a value of z=6 for example, a sum of the maximum sample differences is obtained for the first 6 maximum sample differences is SMA(6)=28.25 volts.

The sum of the maximum sample differences SMA, or its amplitude, is compared with the first and/or second threshold value SW1, SW2 and if the value is exceeded in terms of amplitude an arc fault detection signal SLES is output.

This has the advantage that a plurality of sequentially occurring voltage jumps are summed and their sum is used for the evaluation of the existence of an arc fault.

In one design of an embodiment of the invention a further threshold value comparison may be provided, to the effect that for the calculation of the sample difference DA(n), the value of DU(n) is set to zero if its amplitude falls below a fourth threshold value SW4.

For a low-voltage network, this fourth threshold value SW4 can be in the range of 8 volts to 50 volts, in particular 10 to 30, more specifically in the range of 10 to 20 or 25 volts.

It may be identical to the amplitude of the first or second threshold value, or be of the same order of magnitude.

This has the advantage that the typical—usually sinusoidal—voltage waveform is either not taken into account, or taken into account less.

For example, in accordance with the example the seventh difference DU(7), which has the value 8 volts, could be below the fourth threshold value SW4 in terms of amplitude which, for example, has an amplitude of 10 volts. This means that the seventh sample difference DA(7) would have the value 0 volts. This is shown in particular in column DA(7) by values of 0 volts in square brackets.

Figure 2:
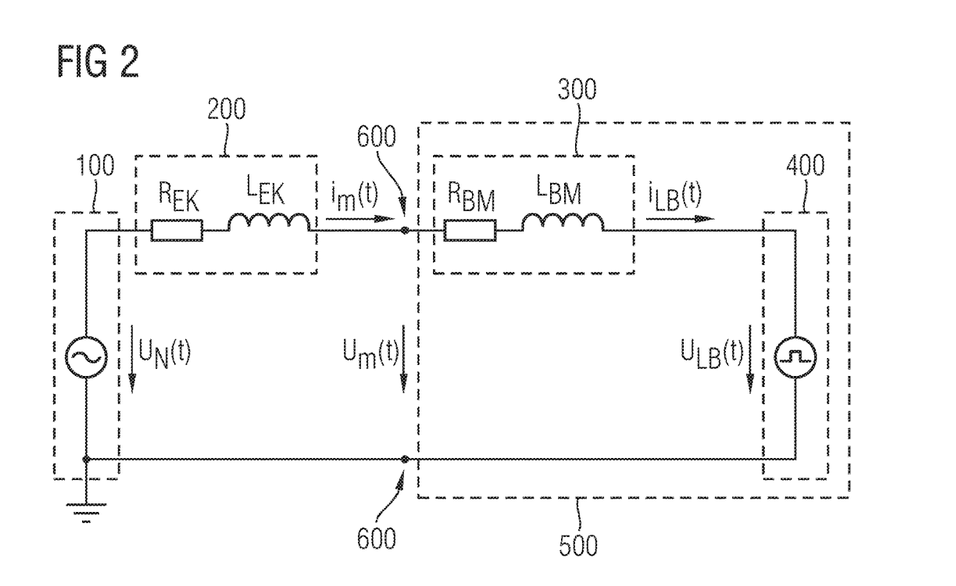
FIG. 2 illustrates an equivalent circuit diagram of an electrical circuit.

FIG. 2 shows an equivalent circuit diagram of an electrical circuit, comprising an electrical power source 100, which provides an electrical mains voltage un(t), a network access or a supply cable 200 connected thereto, represented by electrical equivalent circuit elements, such as a supply cable resistance Rek and a supply cable inductance or coil Lek, which is followed by an electrical consumer, item of equipment or energy sink 300, in turn represented by electrical equivalent circuit elements, such as a consumer resistance RBM and a consumer inductance or coil LBM. Between the supply cable 200 and consumer 300 an electrical voltage um(t) and an electric current parameter, such as the electric current value im(t) and/or the change in the current with respect to time i'm(t), or rather the first derivative of the current with respect to time, can be measured.

These parameters, in particular the electrical voltage or electrical voltage values, are detected at the measuring points 600, in order to be further processed in the arc fault detection unit.

The region which is monitored with regard to arc faults is indicated by a dashed line 500.

In the electrical circuit an arc fault can occur, which is represented by an arc 400 with an arc voltage Ulb(t).

The arc fault detection unit according to the invention can be combined with other criteria. For example, with a further comparison of the magnitude of the electrical current of the circuit. The measured current, in particular the RMS value of the measured current, which can be calculated for example according to the Mann-Morrison method, is then compared with a third threshold value SW3, and only if this third threshold value SW3 is also exceeded and the criterion for an arc fault detection signal is fulfilled is such a signal then output.

This criterion, designated as a current interlock, leads to a reliable fault demarcation. For the arc fault detection a minimum arc fault current must flow in the circuit in order to cause an arc fault detection signal. As a threshold value for the current interlock, a value dependent on the operating current can be selected. As an alternative, the threshold definition could also be made on an arc-specific basis, since for a burning parallel low voltage arc an arc current of 1000 A is typically required. A serial arc is possible at much lower currents. In other words this means that the third threshold value SW3 can have any value from 1 A, 10 A, 100 A, 1000 A or 5000 A depending on the usage or application.

Figure 4:
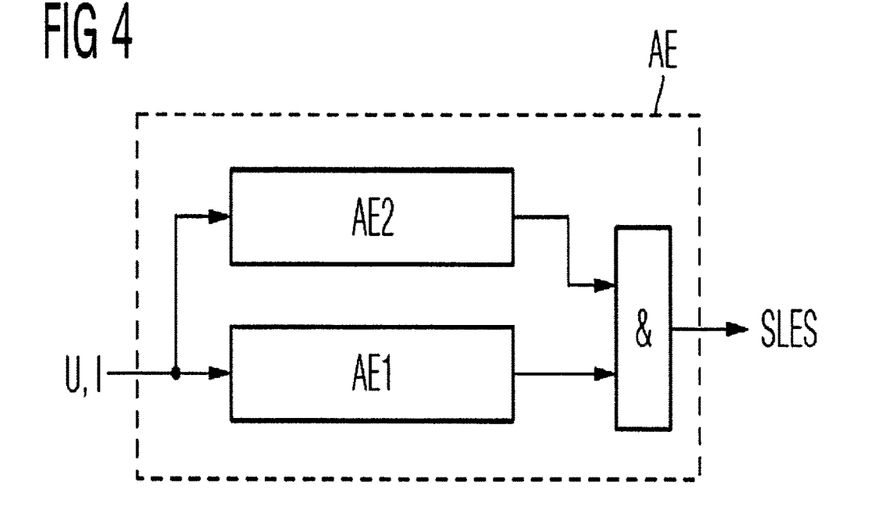
FIG. 4 illustrates a block circuit diagram of a solution according to an embodiment of the invention.

The relationship between current interlock and the arc voltage calculation according to the invention is shown in FIG. 4.

FIG. 4 shows a representation in which the determined voltage U or um(t) and the determined current magnitude of the electrical circuit are fed to a first evaluation unit AE1, for determining the arc voltage according to the invention.

The determined current magnitude of the electrical circuit is fed to a second evaluation unit AE2, for checking the current criterion—exceeding the third threshold value SW3.

The outputs of the two evaluation units AE1, AE2 are connected via an AND gate &, the output of which outputs an arc fault detection signal SLES if the criteria are fulfilled.

The two evaluation units can be arranged in an evaluation unit AE as partial units or sub-units.

Furthermore, the outputting of an arc fault detection signal can be made to only occur if the difference or difference sum and/or the power criterion exceeds the corresponding threshold value at least twice. Analogously, exceeding the threshold value three times, four times, five times, etc. can also lead to the outputting of an arc fault detection signal. This enables a particularly reliable evaluation and detection of an arc fault to be achieved.

Figure 5:
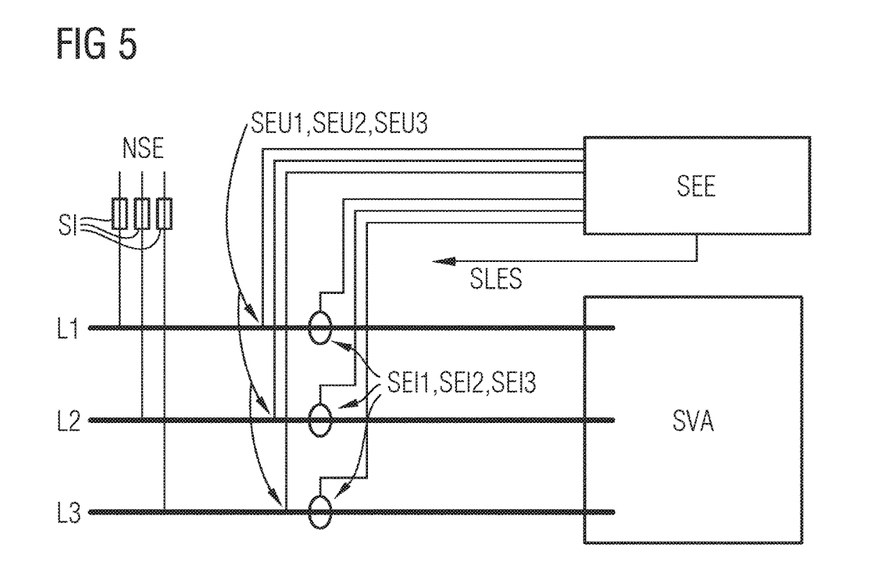
FIG. 5 is a first illustration for the purpose of explaining the use of an embodiment of the invention.

FIG. 5 shows a schematic representation of an overview circuit diagram for a system configuration with an output-selective arc fault detection unit for detecting arc faults. FIG. 5 shows a low voltage supply NSE, with fuses SI, which are followed by power rails or busbars L1, L2, L3 for the conductors of a three-phase AC network or electrical circuit. The neutral conductor or zero conductor is not shown. Each of the three power rails L1, L2, L3 is assigned a voltage sensor SEU1, SEU2, SEU3 and a current sensor SEI1, SEI2, SEI3. The power rails are connected to a switching and/or distribution system SVA.

The voltage and current sensors are connected to an arc fault detection unit SEE according to the invention, which comprises an evaluation unit AE according to an embodiment of the invention. This comprises an output for outputting an arc fault detection signal SLES.

The voltage and current sensors determine voltage values and current magnitudes (current value and/or current change) of the busbars L1, L2, L3 and feed them to the arc fault detection unit SEE according to an embodiment of the invention.

The sensors are arranged outside of the arc fault detection unit and connected thereto.

Figure 6:
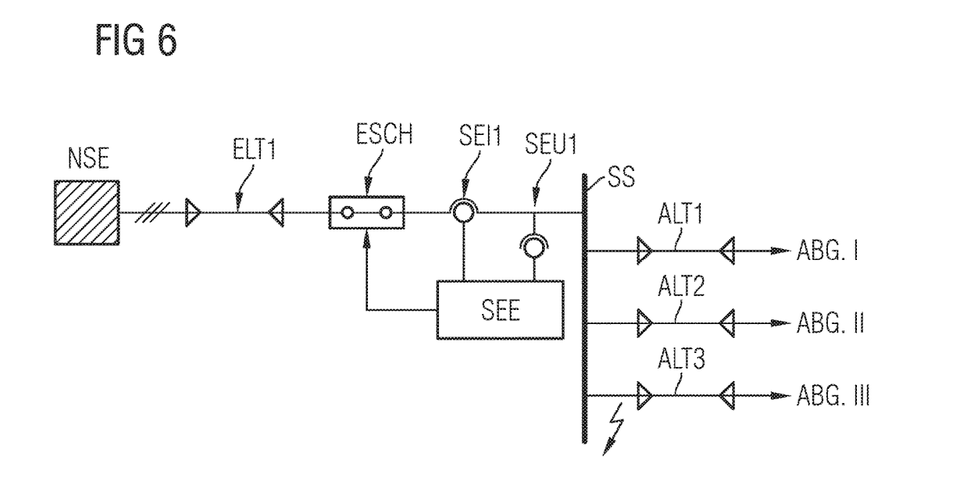
FIG. 6 is a second illustration for the purpose of explaining the use of an embodiment of the invention.

FIG. 6 shows a further schematic representation of an overview circuit diagram for a system configuration with an arc fault detection unit for detecting arc faults. FIG. 6 shows a low-voltage supply NSE, followed by a supply cable ELT1 in turn followed by a supply switch ESCH, followed by a current sensor SEI1 and a voltage sensor SEU1, followed by a busbar SS. On the busbar SS, 3 output circuits ABG I, ABG II and ABG III are provided. To each of these an output cable ALT1, ALT2, ALT3 is assigned.

The sensors SEI1, SEU1 are connected to an arc fault detection unit SEE, the output of which is in turn connected to the supply switch ESCH. The supply switch can be a circuit breaker. In the event that an arc fault is detected, the electrical circuit, i.e. the power supply of the busbar SS, can be interrupted, for example if an arc fault occurs in one of the output circuits.

Figure 7:
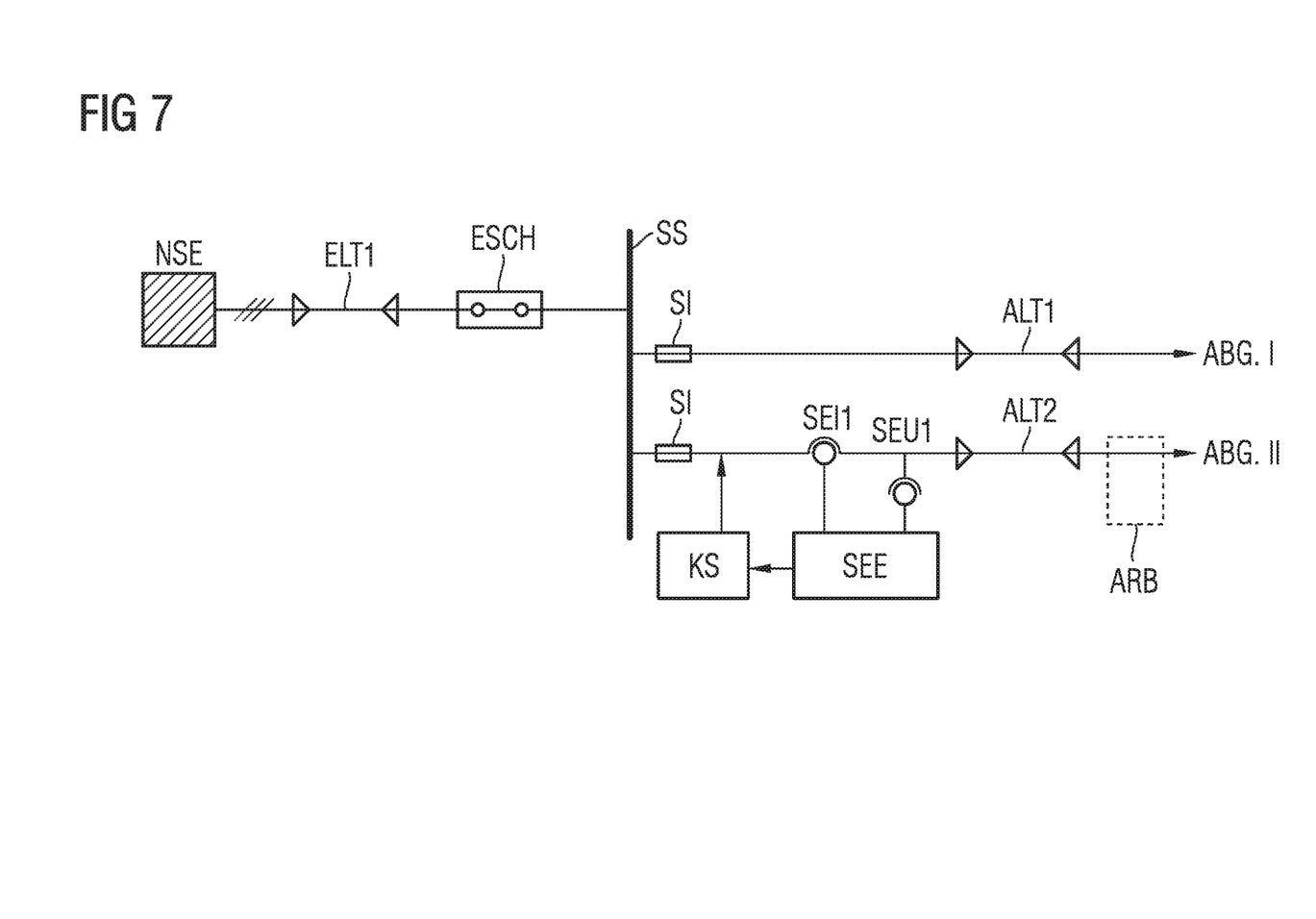
FIG. 7 is a third illustration for the purpose of explaining the use of an embodiment of the invention.

FIG. 7 shows a representation according to FIG. 6, with the difference that the sensors are arranged in the second output circuit ABG II, which also comprises fuses SI and an earthing switch KS. The sensors SEI1 and SEU1 detect current and voltage values of the output circuit ABG II and forward these to the arc fault detection unit SEE. If the arc fault detection unit SEE detects an arc fault, an arc fault detection signal is output at its output and transmitted to the earthing switch KS. This then short-circuits the output circuit ABG II in order to extinguish the arc.

The arc fault detection according to FIG. 6 or 7 can be designed, for example, as a mobile system.

An embodiment of the invention will be explained again hereafter.

An embodiment of the invention enables arc faults to be detected, in particular parallel or high-current, in particular in low voltage switching and distribution systems. According to an embodiment of the invention, in particular a numerical solution or detection algorithm based on the evaluation of the measured voltage or current values or signals is also provided. In particular, for detecting arc faults, the voltage is measured and using a calculation according to an embodiment of the invention, an arc fault is determined. On the basis of the fast arc detection required in practice, according to an embodiment of the invention an extremely fast evaluation in terms of time can be provided.

With an embodiment of the invention, for example, on the basis of a central voltage or current measurement at the supply, high-current arc faults, for example in switchgear and distribution systems, e.g. in the low voltage range, can be rapidly detected.

An embodiment of the invention can be advantageously used in particular in, or in conjunction with, circuit breakers or earthing switches.

No elaborate installation of fiber-optic cables is required in systems to provide arc fault detection. The voltage and current measurement can be implemented centrally and if necessary, can be used synergetically by other resources.

In addition, it is simple to implement in existing switchgear and distribution systems, as a detection system according to an embodiment of the invention, for example, only has to be installed centrally and no installation is required in individual cells to be protected.

An embodiment of the invention can be implemented as a module with central voltage and current determination.

The detection systems previously established on the market are based on an optical fault detection and are therefore potentially liable to false alarms due to the influence of extraneous light (e.g. lightning). In the solution according to the invention based on a voltage or current measurement, this potential hazard does not exist.

Although the invention has been illustrated and described in greater detail by way of the example embodiment, the invention is not restricted by the examples disclosed and other variations can be derived therefrom by the person skilled in the art without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

LIST OF REFERENCE NUMERALS

A amperes
ABG I output circuit I
ABG II output circuit II
ABG III output circuit III
ALT 1 output cable 1
ALT 2 output cable 2
ALT 3 output cable 3
ARB operating range
AE evaluation unit
AE1 first evaluation (sub-)unit
AE2 second evaluation (sub-)unit
ELT1 supply cable 1
ESCH supply switch, circuit breaker
I electric current
$i_{lb}$ arc current
$i_m$ current value, measured
$i'_m$ value of change in current value
KS earthing switch
$L_{BM}$ consumer inductance
$L_{EK}$ supply cable inductance
L1 power rail, conductor 1
L2 power rail, conductor 2
L3 power rail, conductor 3
ms milliseconds
NSE low-voltage supply
$R_{BM}$ consumer resistance
$R_{EK}$ supply cable resistance
SEE arc fault detection unit
SEI1 current sensor
SEI2 current sensor
SEI3 current sensor
SEU1 voltage sensor
SEU2 voltage sensor
SEU3 voltage sensor
SLES arc fault detection signal
SI fuse
SS busbar
SVA switching and distribution system
SW1 arc voltage threshold value
SW2 arc voltage threshold value
SW3 current interlock threshold value
SW4 difference threshold value
t time
U electrical voltage
$U_{lb}$ arc voltage
$u_m$ voltage value, measured
$u_n$ voltage value, power source/mains
V volts
& AND gate
1 step 1—continuous calculation
2 step 2—threshold value comparison
3 step 3—output of arc fault detection signal
4 step 4—no arc fault
100 power source
200 mains access/supply cables
300 consumer/equipment/energy sink
400 arc
500 monitored region
600 measurement points

What is claimed is:

1. An arc fault detection unit for a low-voltage electrical circuit, comprising:
at least one voltage sensor to periodically determine electrical voltage values of the low-voltage electrical circuit, the at least one voltage sensor being connected to an evaluation unit designed to continuously sum a first half of a first number of the electrical voltage values to form a first partial sum and to continuously sum a second half of the electrical voltage values to form a second partial sum, wherein a difference of the first and second partial sums is calculatable, and wherein at least one of
the difference or an amplitude of the difference is configured to be compared with a first threshold value and in response to the threshold value being exceeded, an arc fault detection signal is configured to be output, and
the difference is configured to be compared with a second threshold value and in response to the threshold value being undershot, an arc fault detection signal is configured to be output.

2. The arc fault detection unit of claim 1, wherein the low-voltage electrical circuit is an AC circuit.

3. The arc fault detection unit of claim 1, wherein the electrical voltage values are periodically determined at a multiple of a frequency of the low-voltage electrical circuit or at a sampling frequency in a range of 1 to 200 KHz.

4. The arc fault detection unit of claim 1, wherein the first number of the electrical voltage values is defined by a time window.

5. The arc fault detection unit of claim 4, wherein a difference calculation is performed for each of the determined electrical voltage values.

6. The arc fault detection unit of claim 5, wherein the difference is multiplied by a factor, a magnitude of the factor depending on the first number.

7. The arc fault detection unit of claim 6, wherein the factor is a product of a constant and a reciprocal of the first number.

8. The arc fault detection unit of claim 1, wherein the first threshold value and the second threshold value have a same value.

9. The arc fault detection unit of claim 1, wherein a second number of differences is continuously summed to form a difference sum, the difference sum being configured to be compared instead of the difference with the first or second threshold values and in response to the first or second threshold values being respectively exceeded or undershot, an arc fault detection signal is configured to be output.

10. The arc fault detection unit of claim 1, further comprising:
at least one current sensor, to periodically determine electric current values of the electrical circuit, the at least one current sensor being connected to the evaluation unit designed such that determined current values are continuously compared with a third threshold value, and only in response to the third threshold value being exceeded, is an arc fault detection signal output.

11. A circuit breaker for a low-voltage electrical circuit, comprising:
the arc fault detection unit of claim 1, connected to the circuit breaker and designed such that in response to an arc fault detection signal being output, the circuit breaker trips to interrupt the electrical circuit.

12. An earthing switch, comprising:
the arc fault detection unit of claim 1, connected to the earthing switch and designed such that in response to an arc fault detection signal being output, the earthing switch short-circuits the electrical circuit, to extinguish an arc fault.

13. The arc fault detection unit of claim 1, wherein a difference calculation is performed for each of the determined electrical voltage values.

14. The arc fault detection unit of claim 1, wherein the difference is multiplied by a factor, a magnitude of the factor depending on the first number.

15. A circuit breaker for a low-voltage electrical circuit, comprising:
the arc fault detection unit of claim 2, connected to the circuit breaker and designed such that in response to an arc fault detection signal being output, the circuit breaker trips to interrupt the electrical circuit.

16. An earthing switch, comprising:
the arc fault detection unit of claim 2, connected to the earthing switch and designed such that in response to an arc fault detection signal being output, the earthing switch short-circuits the electrical circuit, to extinguish an arc fault.

17. A circuit breaker for a low-voltage electrical circuit, comprising:
the arc fault detection unit of claim 3, connected to the circuit breaker and designed such that in response to an arc fault detection signal being output, the circuit breaker trips to interrupt the electrical circuit.

18. An earthing switch, comprising:
the arc fault detection unit of claim 3, connected to the earthing switch and designed such that in response to an arc fault detection signal being output, the earthing switch short-circuits the electrical circuit, to extinguish an arc fault.

19. A method for arc fault detection for an electrical circuit, comprising:
periodically determining electrical voltage values of the electrical circuit;
continuously summing a first half of a first number of the electrical voltage values to form a first partial sum and continuously summing a second half of the electrical voltage values to form a second partial sum;
calculating a difference of the first and second partial sums; and
at least one of
comparing the difference or an amplitude of the difference with a first threshold value and in response to the first threshold value being exceeded, outputting an arc fault detection signal, and
comparing the difference with a second threshold value and in response to the second threshold being undershot, outputting an arc fault detection signal.

20. The method of claim 19, wherein a second number of differences is continuously summed to form a difference sum, the difference sum being compared instead of the difference with the first or second threshold value and in response to a respective one of the first and second threshold the value being respectively exceeded or undershot, an arc fault detection signal is output.

21. The method of claim 19, wherein the electrical voltage values are determined at a multiple of a frequency of the low-voltage electrical circuit or at a sampling frequency in a range of 1-100 KHz or wherein the difference is multiplied by a factor, the magnitude of the factor depending on the first number.

22. The method of claim 19, wherein the arc fault detection signal is used to interrupt or short-circuit the electrical circuit.

23. The method of claim 20, wherein the electrical voltage values are determined at a multiple of a frequency of the low-voltage electrical circuit or at a sampling frequency in a range of 1-100 KHz or wherein the difference is multiplied by a factor, the magnitude of the factor depending on the first number.

24. The method of claim 20, wherein the arc fault detection signal is used to interrupt or short-circuit the electrical circuit.

25. The method of claim 21, wherein the arc fault detection signal is used to interrupt or short-circuit the electrical circuit.

* * * * *